US009503102B2

(12) United States Patent
Cheren (10) Patent No.: US 9,503,102 B2
(45) Date of Patent: Nov. 22, 2016

(54) SYNCHRONIZATION FOR MULTIPLE ARBITRARY WAVEFORM GENERATORS

(71) Applicant: Tektronix, Inc., Beaverton, OR (US)

(72) Inventor: Geoffrey D. Cheren, Beaverton, OR (US)

(73) Assignee: TEKTRONIX, INC., Beaverton, OR (US)

( * ) Notice: Subject to any disclaimer, the term of this patent is extended or adjusted under 35 U.S.C. 154(b) by 19 days.

(21) Appl. No.: 14/577,952

(22) Filed: Dec. 19, 2014

(65) Prior Publication Data

US 2016/0065221 A1   Mar. 3, 2016

Related U.S. Application Data

(60) Provisional application No. 62/043,991, filed on Aug. 29, 2014.

(51) Int. Cl.

| | |
|---|---|
| *H03L 7/06* | (2006.01) |
| *H03L 7/083* | (2006.01) |
| *G06F 1/10* | (2006.01) |
| *H03M 1/06* | (2006.01) |
| *H03M 1/66* | (2006.01) |
| *H03M 1/10* | (2006.01) |
| *H03M 1/08* | (2006.01) |

(52) U.S. Cl.
CPC ............. *H03L 7/083* (2013.01); *G06F 1/10* (2013.01); *H03M 1/0624* (2013.01); *H03M 1/1009* (2013.01); *H03M 1/66* (2013.01); *H03M 1/0836* (2013.01)

(58) Field of Classification Search
CPC ................ H03F 3/195; H03F 1/0227; H03F 1/0277
See application file for complete search history.

(56) References Cited

U.S. PATENT DOCUMENTS

| | | |
|---|---|---|
| 7,079,064 B1 | 7/2006 | Bell et al. |
| 2007/0046349 A1 | 3/2007 | Fujisawa et al. |
| 2008/0080648 A1* | 4/2008 | Leung ................. G06F 1/08 375/354 |
| 2013/0093609 A1* | 4/2013 | Chang ................. H03M 1/462 341/110 |

OTHER PUBLICATIONS

European Search Report, Jan. 28, 2016, 10 pages, EP Application No. 15182938.9, European Patent Office, Munich, Germany.

* cited by examiner

*Primary Examiner* — Sibin Chen
(74) *Attorney, Agent, or Firm* — Marger Johnson (57) ABSTRACT

A system and method synchronizes multi-AWG system, where such systems are of a type having a master arbitrary waveform generator (AWG), one or more slave AWGs, and a sync hub having a sync controller and sync phase detector. The method operates by receiving at the sync hub a divided down clock (SystemRefClock) signal from a master arbitrary waveform generator (AWG). The method then derives a clock signal (SystemClock) from the SystemRefClock signal received from the master AWG and outputs the SystemClock signal to the master AWG and to the one or more slave AWGs Finally, the SystemClock signal is used to clock a synchronous trigger for the master AWG and one or more slave AWGs to play a waveform. In one aspect, the synchronous trigger includes AlignmentFiducial and Run signals to effect trigger and play commands.

20 Claims, 3 Drawing Sheets

AWG Alignment Process

FIG. 3
Calibrating Sync Phase Detector

SYNCHRONIZATION FOR MULTIPLE ARBITRARY WAVEFORM GENERATORS

CROSS-REFERENCES TO RELATED APPLICATIONS

This application claims the benefit from U.S. Provisional Patent Application No. 62/043,991 filed Aug. 29, 2014 whose contents are incorporated herein for all purposes.

BACKGROUND OF THE INVENTION

1. Field of the Invention

This disclosure relates generally to synchronization of signal generators, and, more specifically, to synchronization for multiple arbitrary waveform generators.

2. Description of the Prior Art

This disclosure relates generally to synchronization of signal generators, and, more specifically, to synchronization for multiple arbitrary waveform generators.

A conventional solution for synchronizing arbitrary waveform generator (AWG) outputs is to fan out a common clock and provide a trigger signal to all of the AWGs from an external source. This method has a disadvantage in that the startup phase relationship of the clocks between AWGs is random every time the clock is turned on or the frequency is changed. Also this requires the use of an oscilloscope and Arbitrary Function Generator (AFG) or user-provided clock and trigger source that meets the requirements.

In the conventional art, the alignment between instruments is currently a three-step process:

First, the instruments are set up with a common reference or external clock and the sample rate is set.

Next, to start waveforms at the same time, the two AWGs can be triggered with a common external trigger. The AWGs are set to synchronous trigger mode, which starts a waveform output on a divided clock edge rather than a sample clock edge. This provides wider setup and hold window trigger timing. The trigger mode must be synchronous with the internal divided clock for synchronizing AWGs and the trigger is provided from an external source like an AFG or customer provided clock signal. Each AWG is setup to start playing output waveforms when a trigger is received.

Finally, when the two AWGs start up, the internal divided clocks start with a random phase relative to one another. As a result, the outputs need to be aligned each time the sample rate is changed or the clock is stopped. In addition, there is timing skew from this divided clock to the output that is unique to each instrument.

Alignment is accomplished by observing the output signal or marker from each AWG and adjusting the clock phase until they line up. This is where there is an element of random chance in the setup. If the initial startup is too far out of alignment, for example greater than 2 ns, then there will not be enough range to adjust the phase of one AWG to line up with the other. In this case one needs to change the clock and change it back to start up in a different phase and restart the system with a common trigger sent again and the skew between the outputs is check again to see if within adjustment range.

It is therefore desired to enable synchronization in multi-AWG systems that better addresses these and other limitations of the prior art.

SUMMARY OF THE INVENTION

Embodiments of the invention include a method and apparatus for synchronizing multiple AWGs so that they operate, from the user's perspective, as a single AWG. An included synchronization hub eliminates the need for extra external equipment to perform the synchronization and eliminates the random trial an error with the prior synchronization methods. Embodiments provide less trigger latency, less latency to start playing, and tighter skew variation between AWGs.

Described in the invention is a system for synchronizing multiple arbitrary waveform generators, which includes a master arbitrary waveform generator (AWG) having a master AWG clock and a master digital to analog converter (DAC). The system further includes one or more slave arbitrary waveform generators (AWGs), where each slave AWG has a slave digital to analog converter (DAC). A sync hub of the system includes a sync controller and sync phase detector. The system is configured with a signal path between the master DAC and the sync phase detector and between the master DAC and sync controller, and between the slave DAC and sync phase detector. The master DAC is configured to generate a divided down clock (SystemRefClock) from the master AWG clock and output said SystemRefClock to said sync hub. An output on the sync hub to the master AWG and slave AWGs is configured for outputting a clock signal (SystemClock) derived from said SystemRefClock, where the SystemClock is used within the AWGs to indicate when to start playing waveforms from the AWGs.

Aspects of the invention further include a method for synchronizing a multi-AWG system of a type having a master arbitrary waveform generator (AWG), one or more slave AWGs, and a sync hub having a sync controller and sync phase detector. The method operates by receiving at the sync hub a divided down clock (SystemRefClock) signal from a master arbitrary waveform generator (AWG). The method then derives a clock signal (SystemClock) from the SystemRefClock signal received from the master AWG and outputs the SystemClock signal to the master AWG and to the one or more slave AWGs Finally, the SystemClock signal is used to clock a synchronous trigger for the master AWG and one or more slave AWGs to play a waveform. In a preferred embodiment of the invention, the synchronous trigger includes an AlignmentFiducial and Run signal.

Other aspects of the invention further include a method for synchronizing multiple instruments comprising a plurality of arbitrary waveform generators (AWGs) using a sync hub of a type having a sync controller and sync phase detector. The method operates by setting a same sample rate for each of the instruments and designating one of the AWGs as a master AWG, where the remaining AWGs are designated as slave AWGs. The method outputs SystemRefClock signals from each of the AWGs to a sync phase detector, compares a phase of the SystemRefClock signal received from the master AWG with a phase from each of slave AWGs, and aligns the phase of the SystemRefClock signals to a target. After the aligning step, a pulse signal (preferably an AlignmentFiducial signal) is output from a sync controller to each of the AWGs so that the pulse signal is received at the AWGs at the same time. The method then simultaneously triggers the reading and writing commands (e.g. for the data FIFOs) for the AWGs on a same clock edge using the pulse signal. Before playing the waveform, but after triggering the FIFOs, a Run pulse signal is sent to the AWGs, which then starts playing the waveforms.

The foregoing and other objects, features and advantages of the invention will become more readily apparent from the

DETAILED DESCRIPTION

Figure 1:
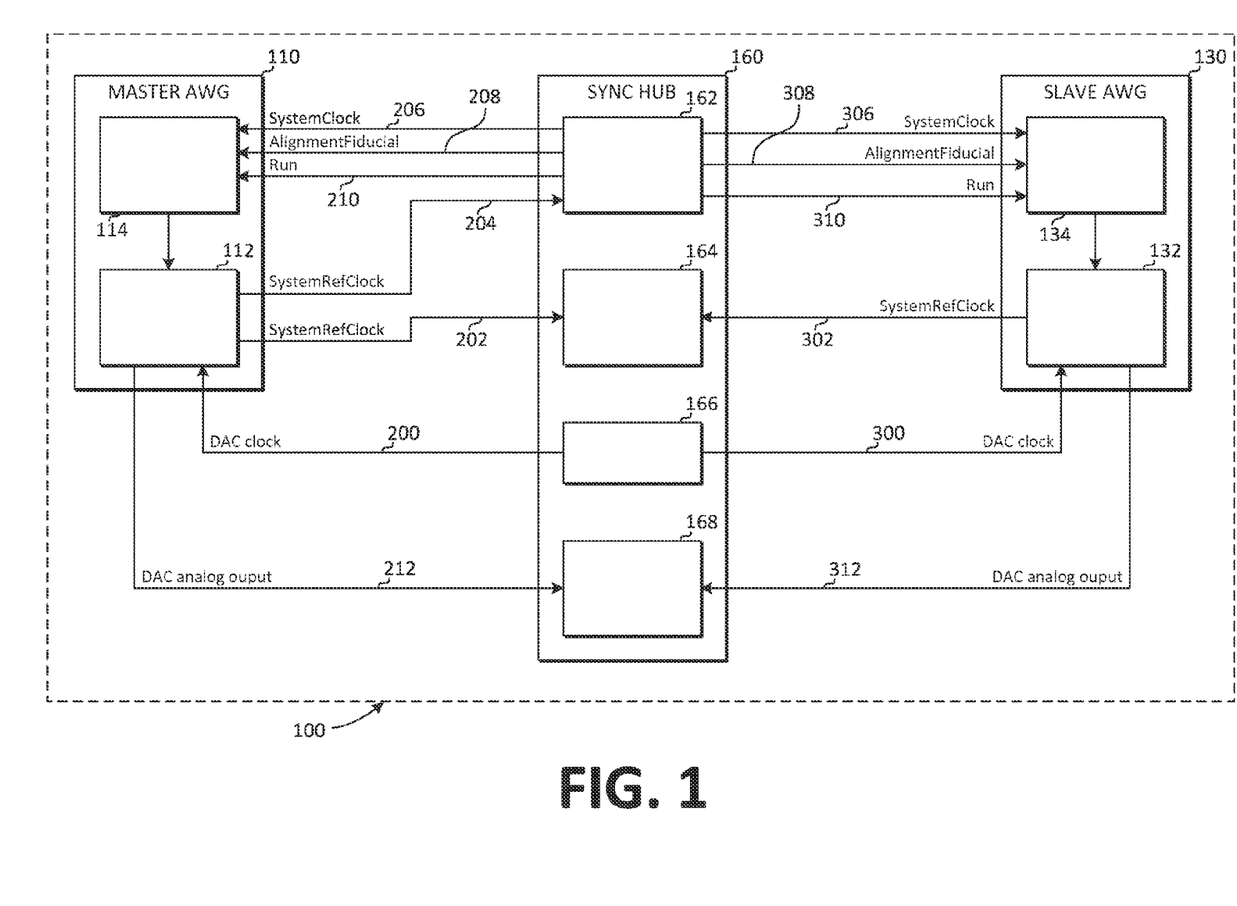
FIG. 1 is a block diagram of a system including a synchronizing hub for synchronizing output signals of two or more signal generators according to embodiments of the invention.

FIG. 1 illustrates two AWGs for ease of explanation, but embodiments of the invention may include more than two AWGs. In general, one of the AWG's 110, 130 in the system 100 is set as the master. For example, in FIG. 1, the AWG 110 is set as the master while the AWG 130 is set as the slave. The master AWG 110 controls the synchronization of the system. The other AWGs, such as AWG 130, are designated as slave instruments.

FIG. 1 includes block representations of operations for synchronizing an AWG system. The blocks may operate on specialized hardware, such as an Application Specific Integrated Circuit (ASIC), on programmable hardware such as a Field Programmable Gate Array (FPGA), or software operating on a specifically programmed general purpose processor, for example. Other implementations are also possible. Different blocks may be configured to operate in any of these implementations.

The master AWG 110 controls the system 100 synchronization. The synchronization process compares everything to the master AWG 110 clocks.

A synchronization hub, or sync hub 160, distributes a clock via DAC Clock Fanout 166 that feeds 200, 300 the Digital to Analog Converters (DACs) 112, 132 that are present within each AWG 110, 130. The source of this clock can be generated from the master AWG 110 or an external signal generator. The DAC 112, 132, generates a divided down clock which is referred to and illustrated as the SystemRefClock. The master and slave(s) AWG SystemRefClock feeds 202, 302 back into a sync hub sync phase detector 164 for use in the synchronization process. The master SystemRefClock is also fed 204 into the hub sync controller 162 which distributes a derived clock from the master SystemRefClock. The SystemRefClock is fed into phase-locked loops (pll) and the output of the pll is distributed as the system clock to the system. This derived clock is referred to in FIG. 1 as the SystemClock.

The SystemClock is distributed 206, 306 to each AWG 110, 130 in the system 100. The SystemClock is used to clock AlignmentFiducial 208, 308 and Run 210, 310 signals to the sequence waveform controller 114, 134 of each AWG 110, 130, which are used to indicate to each instrument when to start playing waveforms. There is a second phase detector circuit called the calibration phase detector 168 in the sync hub 160 that is used with the analog output 212, 312 of each AWG 110, 130 to calibrate the sync phase detector 164 over its operating frequency range.

AWG Alignment Process

Embodiments of the invention extend a synchronization process that occurs in a single instrument to multiple instruments. Embodiments work with any number of slave instruments. Every time the sample rate changes, the AWGs in the system go through this alignment process. All instruments run the same sample rate.

Figure 2:
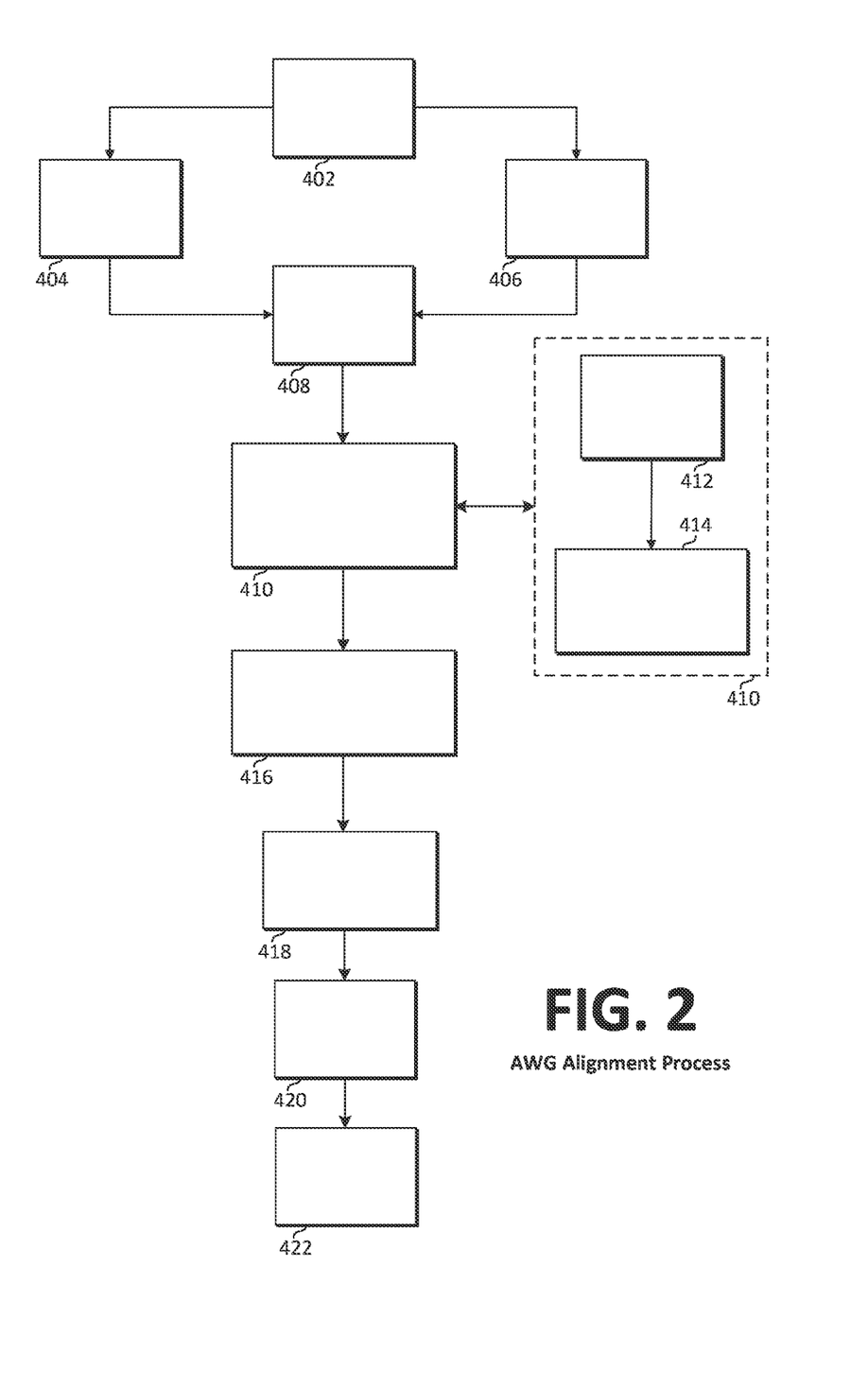
FIG. 2 is a flow diagram illustrating an alignment process of the arbitrary waveform generator (AWG) system according to aspects of the invention.

FIG. 2 illustrates the AWG alignment process.

The first step 402 is for the user to select the desired clock rate by either setting the desired rate in the Master AWG 110 (step 404) or with an external signal generator (step 406).

After the clock has been set, the DAC's clocking circuit is reset 408 and the Slave's SystemRefClock is aligned 410 to the master's SystemRefClock. This is done by using the sync phase detector 164 in the hub 160 to compare 412 the phase between master and slave SystemRefClock 202, 302. The slave AWG 130 clock phase is rotated 414 using an IQ modulator located within DACs 112, 132 until the master and slave SystemRefClock phase reaches the calibration target. One calibration target would be the desired phase difference between the master SystemRefClock and slave SystemRefClock to produce zero skew on the master and slave DAC analog output After the SystemRefClock alignment, each AWG in the system is set up to receive 416 the AlignmentFiducial pulse 208, 308. This is used to get all of the data FIFOs feeding the DAC in the AWG to start reading and writing 418 on the same clock edge. The AlignmentFiducial is one SystemClock tick wide that is sent from the synch hub 160 so that all instruments receive the signal at the same time. The AlignmentFiducial is time aligned at each instrument along with the SystemClock so that pulse is received on the same clock edge.

The last step is to start the system 100 playing 422 waveforms. This is done by sending in block 420 a one SystemClock tick wide pulse on the Run line 210, 310 to start all AWGs 110, 130 playing the waveforms.

Calibrating the Sync Phase Detector

The sync phase detector 160 is calibrated to remove cable and instrument-to-instrument skew variation. This is done by using a calibration phase detector 168. Each AWG 110, 130 is configured to output a square wave out of its DAC analog output. The AWG system 100 is calibrated over multiple operating frequency points.

Figure 3:
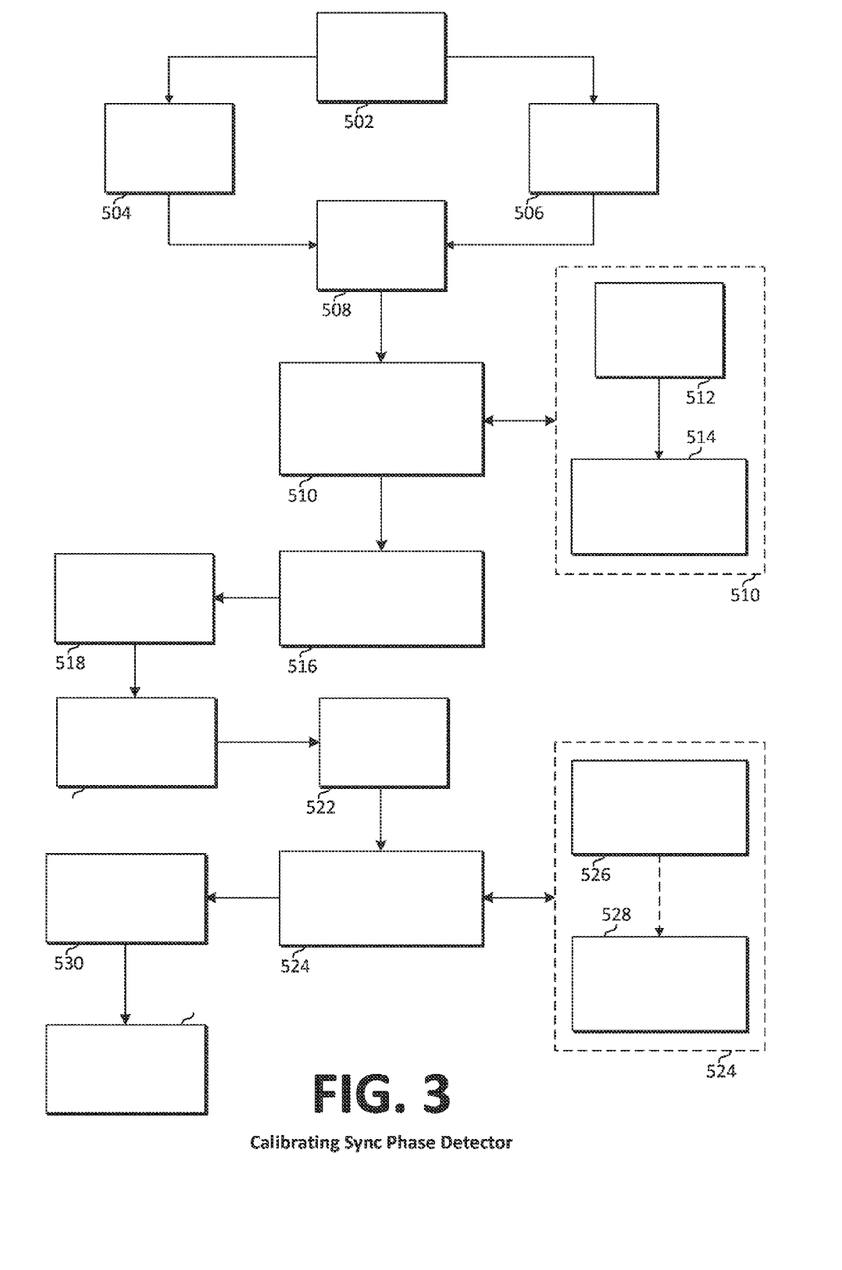
FIG. 3 is a flow diagram illustrating a calibration process of the AWG system according to aspects of the invention.

FIG. 3 illustrates the process for calibrating AWG an AWG within a multi-AWG system.

The first step for the calibration is to set the clock rate 502 by either setting in the Master AWG 110 (step 504) or with an external signal generator (step 506).

After the clock has been set, the DAC's clocking circuit is reset 508 and the Slave's SystemRefClock is aligned 510 to the master's SystemRefClock. This is done by using the sync phase detector 164 in the hub 160 to compare 512 the phase between master and slave SystemRefClock. The slave AWG clock phase is rotated 514 using an IQ modulator until the master and slave SystemRefClock phase has reached the default target. A preferred example of a default target is where the master and slave SystemRefClocks have zero (0) phase difference.

After the SystemRefClock alignment, each AWG 110, 130 in the system 100 is setup to receive 516 the AlignmentFiducial pulse 208, 308. This is used to get all of the data FIFOs feeding the DAC in the AWG to start reading and writing 518 on the same clock edge. The AlignmentFiducial is one SystemClock tick wide that is sent from the sync hub 160 and all instruments receive at the same time.

The next step is to start the system playing 522 waveforms. This is done by sending in block 520 a one SystemClock tick wide pulse on the Run line 210, 310 to start all AWGs 110, 130 playing the square wave waveforms.

After the square wave is being output, the slave's DAC analog output 312 is aligned 524 to the master's DAC analog output 212. This is done by using the calibration phase detector 168 in the hub 160 to compare 526 the phase between master and slave DAC analog outputs. The slave AWG clock phase is rotated 528 using an IQ modulator until the master and slave DAC analog output phase have alignment on the calibration phase detector.

Then, the sync phase detector 164 is read to get the target value to be used on subsequent alignments after the calibration process and then saved 530 so that the target value can be used in block 532 in subsequent alignments. A preferred example of a target value is the desired phase difference between the master SystemRefClock and slave SystemRefClock necessary to produce zero skew on the master and slave DAC analog output. This is the same value used in the alignment Process noted above.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. A system for synchronizing multiple arbitrary waveform generators comprising:
    a master arbitrary waveform generator (AWG) having a master AWG clock and a master digital to analog converter (DAC);
    one or more slave arbitrary waveform generators (AWGs), each having a slave clock and a slave digital to analog converter (DAC);
    a sync hub having a sync controller and sync phase detector;
    a signal path between the master DAC and the sync phase detector and between the master DAC and sync controller, and between the slave DAC and sync phase detector;
    wherein said master DAC is configured to generate a divided down clock (SystemRefClock) from the master AWG clock and output said SystemRefClock to said sync hub;
    wherein the one or more slave DACs are configured to align the phase of the slave clock to the phase of said SystemRefClock; and
    an output on the sync hub to the master AWG and one or more slave AWGs configured for outputting a clock signal (SystemClock) derived from said SystemRefClock, said SystemClock being used within the AWGs to indicate when to start playing waveforms from the AWGs.

2. The system of claim 1, wherein the master AWG clock is generated internally within the master AWG.

3. The system of claim 1, wherein the master AWG clock is provided to the master AWG from an external signal generator.

4. The system of claim 1, wherein the sync hub further includes a calibration phase detector configured to receive an analog output of the master AWG and the one or more slave AWGs and calibrate the sync phase detector over an operating frequency range.

5. The system of claim 1, wherein the one or more slave DACs are configured to output SystemRefClock signals to said sync hub along said signal path between the one or more slave DACs and the sync phase detector.

6. The system of claim 1, further including output line pairs from the sync controller to each of the multiple arbitrary waveform generators configured to carry a tick-wide clock alignment (AlignmentFiducial) signal and a tick-wide pulse (Run) signal operative with the SystemClock signal to start playing the waveform from the respective AWGs.

7. The system of claim 1, the sync hub further including a DAC clock fanout configured to output a DAC clock signal to the master DAC and one or more slave DACs.

8. A method for synchronizing a multi-AWG system of a type having a master arbitrary waveform generator (AWG), one or more slave AWGs, and a sync hub having a sync controller and sync phase detector, the method comprising:
    receiving at the sync hub a divided down clock (SystemRefClock) signal from the master arbitrary waveform generator (AWG);
    deriving a clock signal (SystemClock) from the SystemRefClock signal received from the master AWG and outputting the SystemClock signal to the master AWG and to the one or more slave AWGs; and
    using the SystemClock signal to clock a synchronous trigger for the master AWG and one or more slave AWGs to play a waveform.

9. The method of claim 8, wherein the synchronous trigger includes a tick-wide clock alignment (AlignmentFiducial) signal and a tick-wide pulse (Run) signal.

10. The method of claim 8, further including the step of receiving an analog output of each AWG in the multi-AWG system at the sync hub and calibrating the sync phase detector over an operating frequency range.

11. The method of claim 8, wherein the master AWG includes a digital-to-analog converter (DAC) and the method further includes outputting the SystemRefClock signal from the DAC of the master AWG to the sync hub.

12. The method of claim 11, further including generating a clock at the master AWG and feeding the clock to the DAC of the master AWG.

13. The method of claim 8, further including generating a clock from an external signal generator and feeding the clock to the DAC of the master AWG.

14. The method of claim 8, wherein the sync hub includes a sync controller and a sync phase detector, the method further including receiving the SystemRefClock signal from the master arbitrary waveform generator (AWG) at the sync controller and receiving the SystemRefClock signal from each AWG in the multi-AWG system at the sync phase detector.

15. A method for synchronizing multiple instruments comprising a plurality of arbitrary waveform generators (AWGs) using a sync hub of a type having a sync controller and sync phase detector, the method comprising:
    setting a same sample rate for each of the instruments;
    designating one of the AWGs as a master AWG, the remaining AWGs being slave AWGs;
    outputting SystemRefClock signals from each of the AWGs to the sync phase detector, comparing a phase of the SystemRefClock signal received from the master AWG with a phase from each of slave AWGs, and aligning the phase of the SystemRefClock signals to a target;
    after the aligning step, outputting a pulse signal from a sync controller to each of the AWGs and receiving the pulse signal at the AWGs at the same time;
    simultaneously triggering reading and writing commands for the AWGs on a same clock edge using the pulse signal; and
    playing waveforms on all of the AWGs.

16. The method of claim 15, wherein the step of playing waveforms includes:
- deriving a clock signal (SystemClock) from the SystemRefClock signal received from the master AWG and outputting the SystemClock signal to the master AWG and to the slave AWGs;
- receiving a SystemClock tick-wide clock alignment signal (AlignmentFiducial) at each of the AWGs at the same time; and
- receiving a SystemClock tick-wide pulse (Run) to start all AWGs playing the waveforms.

17. The method of claim 15, wherein the step of simultaneously triggering includes:
- simultaneously triggering reading and writing the data FIFOs for the AWGs on the same clock edge using the pulse signal; and
- after triggering the data FIFOs, transmitting a Run pulse signal to the AWGs as a trigger for playing the waveforms.

18. The method of claim 15, wherein the target is a default target.

19. The method of claim 18, wherein the waveforms are square waveforms.

20. The method of claim 19, wherein each AWG includes a digital-to-analog converter (DAC), the method further including aligning an analog output of the DAC of each of the AWGs with an analog output of the DAC of the master AWG by:
- comparing a phase of the analog output of the master AWG with phases of the analog outputs of each of the AWGs;
- rotating the phases of the analog outputs of each of the AWGs using an IQ modulator until the master and slave DAC analog output phases having alignment on a calibration phase detector; and
- using target as a calibration target in a subsequent alignment.

* * * * *

UNITED STATES PATENT AND TRADEMARK OFFICE
CERTIFICATE OF CORRECTION

PATENT NO. : 9,503,102 B2
APPLICATION NO. : 14/577952
DATED : November 22, 2016
INVENTOR(S) : Cheren It is certified that error appears in the above-identified patent and that said Letters Patent is hereby corrected as shown below:

On the Title Page

The title page showing the illustrative figure should be deleted to be replaced with the attached title page.

In the Drawings

Drawing Sheet 1 of 3, replace Fig. 1 with the Fig. 1 as shown on the attached Drawing Sheet.

Drawing Sheet 2 of 3, replace Fig. 2 with the Fig. 2 as shown on the attached Drawing Sheet.

Drawing Sheet 3 of 3, replace Fig. 3 with the Fig. 3 as shown on the attached Drawing Sheet.

Signed and Sealed this
Fifteenth Day of December, 2020

Andrei Iancu
*Director of the United States Patent and Trademark Office*

CERTIFICATE OF CORRECTION (continued)

(12) United States Patent
Cheren (10) Patent No.: US 9,503,102 B2
(45) Date of Patent: Nov. 22, 2016

(54) SYNCHRONIZATION FOR MULTIPLE ARBITRARY WAVEFORM GENERATORS

(71) Applicant: Tektronix, Inc., Beaverton, OR (US)

(72) Inventor: Geoffrey D. Cheren, Beaverton, OR (US)

(73) Assignee: TEKTRONIX, INC., Beaverton, OR (US)

(*) Notice: Subject to any disclaimer, the term of this patent is extended or adjusted under 35 U.S.C. 154(b) by 19 days.

(21) Appl. No.: 14/577,952

(22) Filed: Dec. 19, 2014

(65) Prior Publication Data
US 2016/0065221 A1 Mar. 3, 2016

Related U.S. Application Data

(60) Provisional application No. 62/043,991, filed on Aug. 29, 2014.

(51) Int. Cl.
| | | |
|---|---|---|
| H03L 7/06 | (2006.01) |
| H03L 7/083 | (2006.01) |
| G06F 1/10 | (2006.01) |
| H03M 1/06 | (2006.01) |
| H03M 1/66 | (2006.01) |
| H03M 1/10 | (2006.01) |
| H03M 1/08 | (2006.01) |

(52) U.S. Cl.
CPC ............ *H03L 7/083* (2013.01); *G06F 1/10* (2013.01); *H03M 1/0624* (2013.01); *H03M 1/1009* (2013.01); *H03M 1/66* (2013.01); *H03M 1/0836* (2013.01)

(58) Field of Classification Search
CPC ............ H03F 3/195; H03F 1/0227; H03F 1/0277
See application file for complete search history.

(56) References Cited

U.S. PATENT DOCUMENTS

| | | |
|---|---|---|
| 7,079,064 B1 | 7/2006 | Bell et al. |
| 2007/0046349 A1 | 3/2007 | Fujisawa et al. |
| 2008/0080648 A1* | 4/2008 | Leung ............ G06F 1/08 375/354 |
| 2013/0093609 A1* | 4/2013 | Chang ............ H03M 1/462 341/110 |

OTHER PUBLICATIONS

European Search Report, Jan. 28, 2016, 10 pages, EP Application No. 15182938.9, European Patent Office, Munich, Germany.

* cited by examiner

*Primary Examiner* — Sibin Chen
(74) *Attorney, Agent, or Firm* — Marger Johnson (57) ABSTRACT

A system and method synchronizes multi-AWG system, where such systems are of a type having a master arbitrary waveform generator (AWG), one or more slave AWGs, and a sync hub having a sync controller and sync phase detector. The method operates by receiving at the sync hub a divided down clock (SystemRefClock) signal from a master arbitrary waveform generator (AWG). The method then derives a clock signal (SystemClock) from the SystemRefClock signal received from the master AWG and outputs the SystemClock signal to the master AWG and to the one or more slave AWGs Finally, the SystemClock signal is used to clock a synchronous trigger for the master AWG and one or more slave AWGs to play a waveform. In one aspect, the synchronous trigger includes AlignmentFiducial and Run signals to effect trigger and play commands.

20 Claims, 3 Drawing Sheets

FIG. 1

FIG. 2
AWG Alignment Process

FIG. 3
Calibrating Sync Phase Detector